(12) United States Patent
Gunturu et al.

(10) Patent No.: US 8,039,312 B1
(45) Date of Patent: Oct. 18, 2011

(54) METHOD FOR FORMING A CAPPED MICRO-ELECTRO-MECHANICAL SYSTEM (MEMS) DEVICE

(75) Inventors: Veera M. Gunturu, Austin, TX (US); Shivcharan V. Kamaraju, Austin, TX (US); Lisa H. Karlin, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/847,465

(22) Filed: Jul. 30, 2010

(51) Int. Cl.
*H01L 21/00* (2006.01)
*H01L 21/30* (2006.01)
*H01L 21/46* (2006.01)

(52) U.S. Cl. ......... 438/110; 438/113; 438/456; 438/458

(58) Field of Classification Search .................. None
See application file for complete search history.

(56) References Cited

U.S. PATENT DOCUMENTS

| | | | |
|---|---|---|---|
| 5,382,551 A | 1/1995 | Thakur et al. | |
| 6,902,656 B2 * | 6/2005 | Ouellet et al. | 204/192.16 |
| 7,046,411 B1 * | 5/2006 | Fleming | 359/224.1 |
| 2003/0228089 A1 | 12/2003 | Blackstone | |
| 2008/0148864 A1 * | 6/2008 | Fleury et al. | 73/788 |
| 2009/0160040 A1 * | 6/2009 | Nabki et al. | 257/678 |
| 2009/0256236 A1 | 10/2009 | Smeys et al. | |

OTHER PUBLICATIONS

U.S. Appl. No. 12/638,424, filed Dec. 15, 2009.

\* cited by examiner

*Primary Examiner* — Scott B Geyer
(74) *Attorney, Agent, or Firm* — Joanna G. Chiu; James L. Clingan, Jr.

(57) ABSTRACT

A capped micro-electro-mechanical systems (MEMS) device is formed using a device wafer and a cap wafer. The MEMS device is located on a frontside of the device wafer. A frontside of a cap wafer is attached to the frontside of the device wafer. A first stressor layer having a tensile stress is applied to a backside of the cap wafer after attaching the frontside of the cap wafer to the frontside of the device wafer. The first stressor layer and the cap wafer are patterned to form an opening through the first stressor layer and the cap wafer after applying the first stressor layer. A conductive layer is applied to the backside of the cap wafer, including through the opening to the frontside of the device wafer.

20 Claims, 4 Drawing Sheets

METHOD FOR FORMING A CAPPED MICRO-ELECTRO-MECHANICAL SYSTEM (MEMS) DEVICE

BACKGROUND

1. Field

This disclosure relates generally to semiconductor processing, and more specifically, to forming a capped MEMS device.

2. Related Art

During the formation of a capped micro-electro-mechanical system (MEMS) device, wafer level packaging is utilized in which a cap wafer is bonded to a device wafer. After bonding the cap wafer to the device wafer, each of the wafers are thinned by a grinding process. However, the resulting warpage of the bonded wafers after grinding may result in various detrimental effects during subsequent processing, such as increased wafer breakage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

During formation of a capped MEMS device, wafer level packaging is utilized in which a cap wafer is bonded to a device wafer (which includes a plurality of MEMS devices) to form a bonded wafer. The bonded wafer is grinded in order to thin both the cap wafer and the device wafer, thus thinning the bonded wafer. However, after thinning, warpage of the bonded wafer is increased. Therefore, in one embodiment, a metal layer is formed over the exposed backside of the cap wafer, prior to any saw process, in order to reduce the warpage prior to sawing. Furthermore, in one embodiment, prior to bonding the cap wafer to the device wafer, a compressive layer is formed on the frontside of the cap wafer (which is opposite the backside of the cap wafer). This compressive layer may aid in further reducing subsequent warpage. In one embodiment, after grinding both the cap wafer and the device wafer to thin the bonded wafer, the exposed backsides of both the cap wafer and the device wafer are polished. This polishing may also further reduce warpage.

Figure 1:
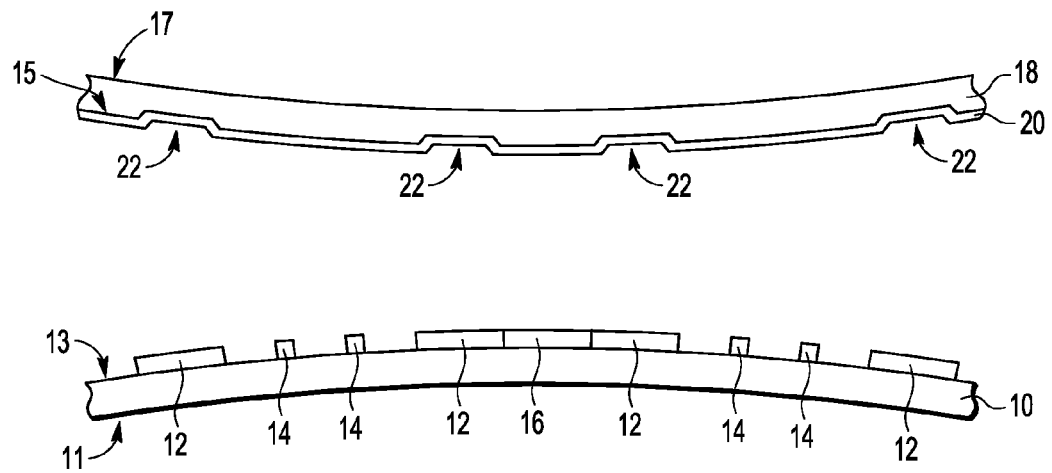
FIG. 1 illustrates, in cross-section form, a cap wafer and a device wafer in accordance with one embodiment.

FIG. 1 illustrates, in cross-section form, a cap wafer 18 and a device wafer 10 in accordance with one embodiment. Device wafer 10 has a frontside 13 and a backside 11, which is opposite frontside 13. Device wafer 10 includes a plurality MEMS devices 12, a plurality of bond pads 14, and a plurality of scribe lines 16 (only one of which is shown in the portion of FIG. 1) located on frontside 13. Device wafer 10, MEMS devices 12, bond pads 14, and scribe lines 16 may be formed as known in the art. Cap wafer 18 has a frontside 15 and a backside 17, which is opposite frontside 15. Cap wafer 18 also includes a plurality of cavities 22 which correspond to the locations of MEMS devices 12 of device wafer 10. In one embodiment, cap wafer 18 may also include cavities, similar to cavities 22, which correspond to locations of bond pads 14 of device wafer 10. A compressive layer 20 is formed over frontside 15 of cap wafer 18 (and within cavities 22). In one embodiment, compressive layer 20 comprises a nitride. In one embodiment, compressive layer 20 is applied directly on the frontside 15 of cap wafer 18 and is in physical contact with frontside 15. Compressive layer 20 may also be described as a stressor layer having a compressive stress. As will be described further below, compressive layer 20 may help in reducing warpage of the bonded wafer.

Figure 2:
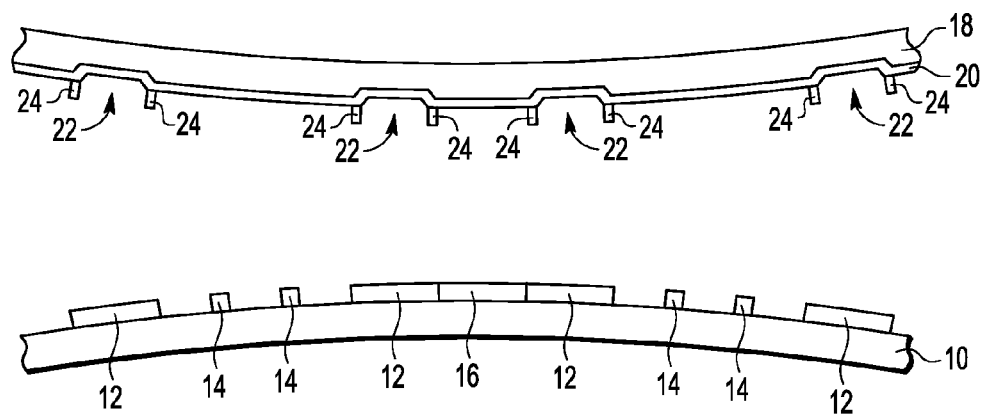
FIG. 2 illustrates, in cross-section form, the cap wafer and device wafer of FIG. 1 after application of a glass frit to the cap wafer, in accordance with one embodiment.

FIG. 2 illustrates, in cross-section form, cap wafer 18 after application of a glass frit layer 24 over compressive layer 20 on frontside 15, in accordance with one embodiment. In one embodiment, glass frit is screen printed onto cap wafer 18 to form glass frit layer 24 (also referred to as a frit layer or frit). Glass frit layer 24 will allow cap wafer 18 to adhere to device wafer 10. Alternatively, other adhesives may be used. Also, in one embodiment, compressive layer 20 may not be present, in which case, glass frit layer 24 will be formed directly on frontside 15 of cap wafer 18. In one embodiment, after formation of glass frit layer 24, cap wafer 18 is cured.

Figure 3:
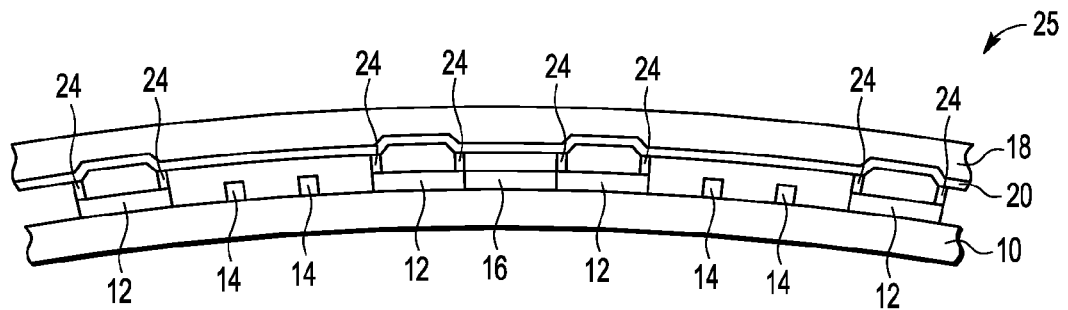
FIG. 3 illustrates, in cross-section form, the cap wafer and device wafer of FIG. 2 after bonding, in accordance with one embodiment.

FIG. 3 illustrates, in cross-section form, cap wafer 18 and device wafer 10 after bonding the two wafers together to form bonded wafer 25, in accordance with one embodiment. Cap wafer 18 is bonded to device wafer 10 such that frontside 15 of cap wafer 18 is directly facing frontside 13 of device wafer 10. That is, frontside 15 of cap wafer 18 is attached to frontside 13 of device wafer 10. In this manner, the backsides of cap wafer 18 and device wafer 10 are exposed, with the frontsides of both cap wafer 18 and device wafer 10 in between the backsides of cap wafer 18 and device wafer 10. In the illustrated embodiment, the pattern formed by glass frit layer 24 contacts frontside 13 of device wafer 10 and adheres to the exposed top surfaces of MEMS devices 12. In one embodiment, cap wafer 18 is held by pressure to device wafer 10 at a high temperature in order for glass frit layer 24 to bond to device wafer 10. After the bonding process, cap wafer 18 and device wafer 10 together form bonded wafer 25.

Figure 4:
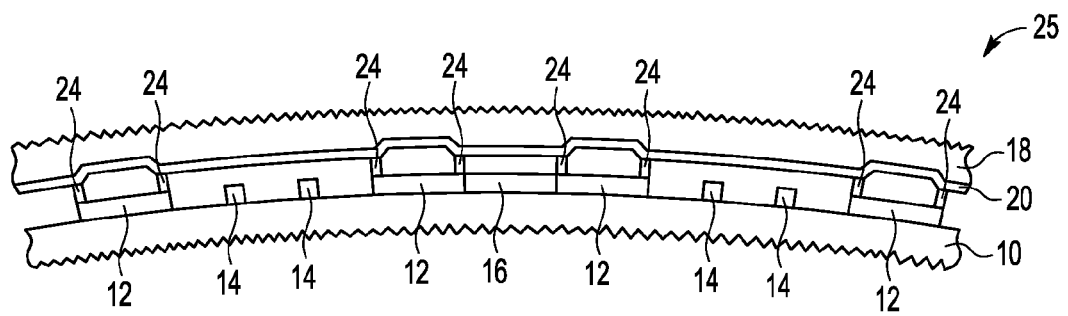
FIG. 4 illustrates, in cross-section form, the bonded wafer of FIG. 3 after a grinding process, in accordance with one embodiment.

FIG. 4 illustrates, in cross-section form, bonded wafer 25 after a grinding process, in accordance with one embodiment. In one embodiment, both backside 17 of cap wafer 18 and backside 11 of device wafer 10 are grinded in order to thin each of cap wafer 18 and device wafer 10. However, note that after the grinding process, the curvature or warpage of bonded wafer 25 increases such that bonded wafer 25 becomes more convex as compared to bonded wafer 25 prior to grinding.

Note that without compressive layer 20, the warpage of bonded wafer 25 after grinding may be even greater. After grinding, the backsides of cap wafer 18 and device wafer 10 are rough due to the grinding process.

Figure 5:
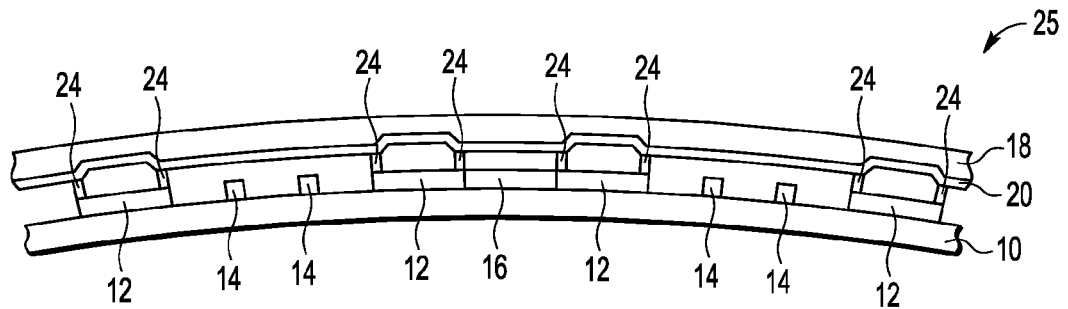
FIG. 5 illustrates, in cross-section form, the bonded wafer of FIG. 4 after polishing, in accordance with one embodiment.

FIG. 5 illustrates, in cross-section form, bonded wafer 25 after polishing, in accordance with one embodiment. In one embodiment, backside 11 of device wafer 10 or backside 17 of cap wafer 18 or both backside 11 and backside 17 are polished, using, for example, chemical mechanical polishing (CMP), to smooth the backsides. In one embodiment, the polishing of the backsides of both cap wafer 18 and device wafer 10 may further reduce the warpage created by the previous grinding process.

Figure 6:
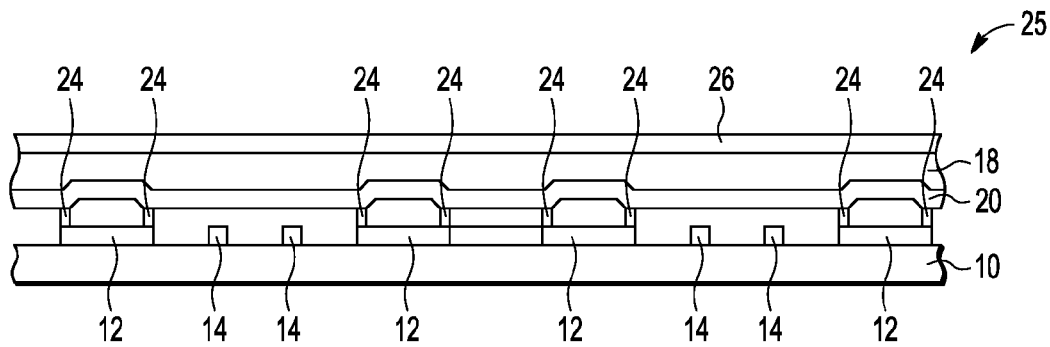
FIG. 6 illustrates, in cross-section form, the bonded wafer of FIG. 5, after the formation of a tensile layer over the cap wafer of the bonded wafer, in accordance with one embodiment.

FIG. 6 illustrates, in cross-section form, bonded wafer 25, after formation of a tensile layer 26 over cap wafer 18, in accordance with one embodiment. In one embodiment, tensile layer 26 is formed directly on backside 17 of cap wafer 18 such that cap wafer 18 is in between glass frit layer 24 and tensile layer 26. Tensile layer 26 may also be described as a stressor layer having a tensile stress. In one embodiment, tensile layer 26 is blanket deposited over backside 17. In one embodiment, tensile layer 26 is a conductive layer, such as a metal layer, and may contain a metal such as aluminum. Since tensile layer 26 is tensile, its formation operates to reduce or eliminate the warpage introduced by previous processing. Therefore, in one embodiment, bonded wafer 25 has less warpage as compared to bonded wafer 25 prior to the formation of tensile layer 26.

Figure 7:
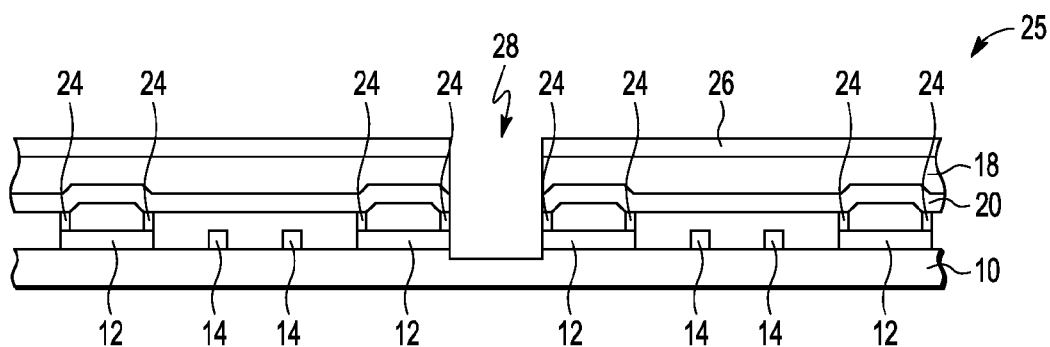
FIG. 7 illustrates, in cross-section form, the bonded wafer of FIG. 6, after a saw-to-ground (STG) process, in accordance with one embodiment.

FIG. 7 illustrates, in cross-section form, bonded wafer 25, after a saw-to-ground (STG) process, in accordance with one embodiment. The STG process illustrated in FIG. 7 uses a saw to cut through cap wafer 18 over scribe lines 16 to create openings 28 (only one of which is shown in FIG. 7) which expose device wafer 10. That is, openings 28 extend through tensile layer 26, cap wafer 18, and nitride layer 20 and extend into frontside 13 of device wafer 10 such that a proper ground connection can then be formed which grounds device wafer 10 to cap wafer 18. Therefore, tensile layer 26 may be patterned to form openings 28 through tensile layer 26 and cap wafer 18.

Figure 8:
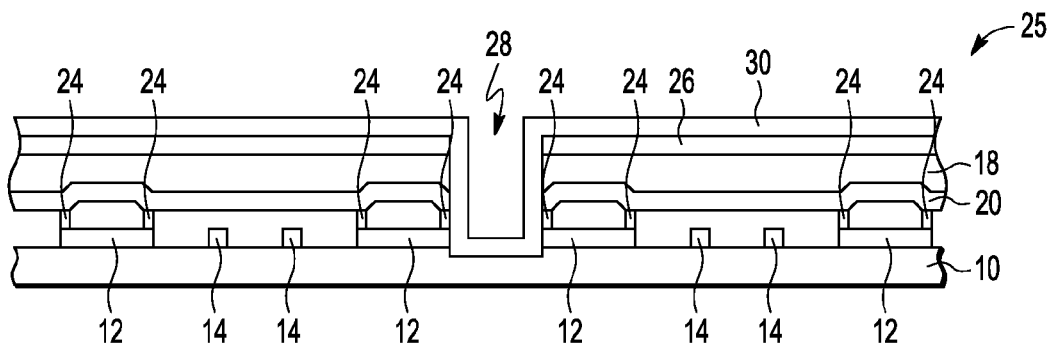
FIG. 8 illustrates, in cross-section form, the bonded wafer of FIG. 7, after formation of a conductive layer over the tensile layer, in accordance with one embodiment.

FIG. 8 illustrates, in cross-section form, bonded wafer 25, after formation of a conductive layer 30 over tensile layer 26 and within opening 28, in accordance with one embodiment. In one embodiment, conductive layer 30 is applied to backside 17 of cap wafer 18 such that it is formed over tensile layer 26 and within opening 28 (but may not completely fill opening 28). That is, conductive layer 30 may be deposited on tensile layer 26 and through opening 28 to contact frontside 13 of device wafer 10. In one embodiment, conductive layer 30 is blanket deposited over backside 17. In this manner, conductive layer 30 creates an electrical connection between device wafer 10 (at the bottom of opening 28) to cap wafer 18. In one embodiment, conductive layer 30 is a metal layer, such as, for example, aluminum. However, other types of conductive materials may be used.

Figure 9:
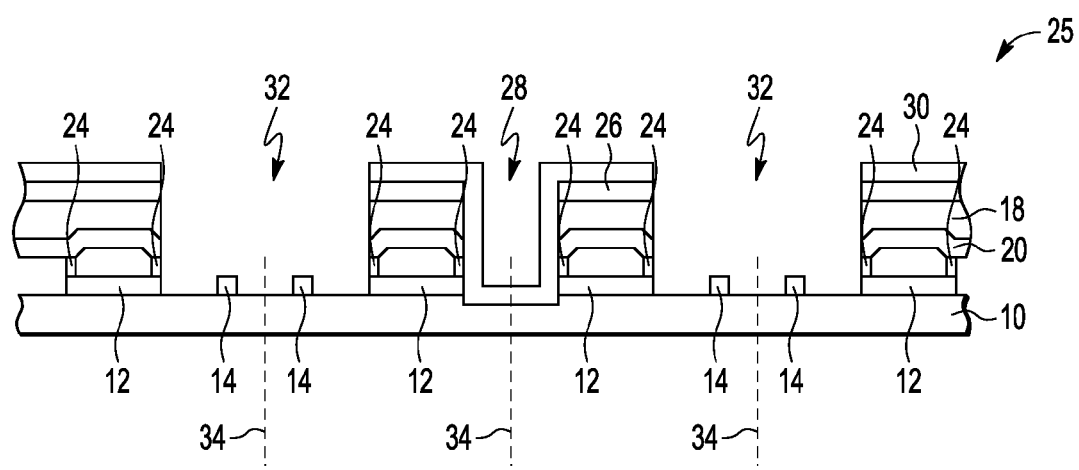
FIG. 9 illustrates, in cross-section form, the bonded wafer of FIG. 8, after a saw process to expose the bond pads of the MEMS devices, in accordance with one embodiment.

FIG. 9 illustrates, in cross-section form, bonded wafer 25, after a saw process to expose bond pads 14 of MEMS devices 12, in accordance with one embodiment. As illustrated in FIG. 9, a partial saw is performed to form openings 32 through cap wafer 10 (and conductive layer 30, tensile layer 26, and nitride layer 20) in order to expose bond pads 14. In this manner, bond pads 14 are exposed by capped MEMS devices 12 to allow for external connections to the MEMS device after singulation. Therefore, in one embodiment, after the saw process to expose bond pads 14, bonded wafer 25 may be singulated along singulation lines 34 in order to separate each MEMS device 12 to form individual packaged or capped MEMS devices. In one embodiment, each singulated package may include one or more MEMS devices and may also include other devices in addition to the one or more MEMS devices. Also, access to each singulated device is provided via corresponding bond pads 14.

By now it should be appreciated that there has been provided a method of forming a capped MEMS device which may allow for reduced warpage. For example, in one embodiment, formation of a tensile layer over the backside of the cap wafer may reduce the warpage previously introduced by the grinding process. Furthermore, the addition of a compressive layer to the frontside of the cap layer prior to bonding and/or the polishing of the backside of the cap layer after the grinding process may further reduce the warpage. By reducing warpage, wafer breaking may also be reduced, thus improving manufacturing yield and device reliability.

Moreover, the terms "front," "back," "frontside," "backside," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different types of compressive materials may be used for compressive layer 20 and different types of tensile materials may be used for tensile layer 26. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of making a capped micro-electro-mechanical systems device, wherein the method includes forming a MEMS device using a device wafer, wherein the MEMS device is located on a frontside of the device wafer; attaching a frontside of a cap wafer to the frontside of the device wafer; applying a first stressor layer having a tensile stress to a backside of the cap wafer after attaching the frontside of the cap wafer to the frontside of the device wafer; patterning the first stressor layer and the cap wafer to form an opening through the first stressor layer and the cap wafer after applying the first stressor layer; and applying a conductive layer to the backside of the cap wafer, including through the opening to the frontside of the device wafer. Item 2 includes the method of item 1 and further includes applying a second stressor layer having a compressive stress to the frontside of the cap wafer prior to the step of attaching. Item 3 includes the method of item 2 and further includes performing chemical mechanical polishing to the backside of the cap wafer prior after the step of attaching and before the step of applying the first stressor layer. Item 4 includes the method of item 3, wherein the step of applying the first stressor layer comprises depositing a first layer of aluminum. Item 5 include the method of item 4, wherein the step of applying the second stressor layer comprises depositing a layer of nitride. Item 6 includes the method of item 5, and further includes performing chemical mechanical polishing to the backside of the device wafer after the step of attaching. Item 7 includes the method of item 6, wherein the step of applying a conductive layer comprises depositing a second layer of aluminum. Item 8 includes the method of item 7 wherein the step of attaching includes applying frit to the frontside of the cap wafer; curing the frit; and contacting the frontside of the device wafer to the frit. Item 9 includes the method of item 1, wherein the step of applying the first stressor layer comprises depositing a first layer of aluminum. Item 10 includes the method of item 9, wherein the step of applying a conductive layer comprises depositing a second layer of aluminum. Item 11 include the method of item 10, and further includes forming a bond pad opening in the cap wafer to expose a plurality of bond pads of the MEMS device.

Item 12 includes a method of forming a packaged micro-electro-mechanical systems (MEMS) device, wherein the MEMS device is located on a frontside of a device wafer, wherein the method includes forming a nitride layer having compressive stress on a frontside of a cap wafer; attaching the frontside of the cap wafer to the frontside of the device wafer; forming a first aluminum layer having tensile stress on the backside of the cap wafer; patterning the first aluminum layer and the cap wafer to form an opening through the cap wafer; and applying a conductive layer to the backside of the cap wafer, including through the opening to the frontside of the device wafer. Item 13 includes the method of item 12, and further includes performing chemical mechanical polishing on the backside of the cap wafer after the step of attaching and before the step of forming the first aluminum layer. Item 14 include the method of item 13, and further includes performing chemical mechanical polishing on the backside of the device wafer after the step of attaching. Item 15 includes the method of item 12, wherein the step of applying the conductive layer includes depositing a second aluminum layer and is further characterized as contacting a ground contact on the device wafer. Item 16 includes the method of item 12, wherein the step of attaching includes applying frit in a pattern to the frontside of the cap wafer; curing the frit; and contacting the frontside of the device wafer to the frontside of the cap wafer.

Item 17 includes a method of packaging a micro-electro-mechanical systems (MEMS) device, wherein the method includes forming the MEMS device on a frontside of a device wafer; attaching a frontside of a cap wafer to the frontside of the device wafer; performing chemical mechanical polishing on the backside of the cap wafer; depositing a first layer of aluminum on the backside of the cap wafer, the first layer of aluminum having tensile stress; forming an opening in the first layer of aluminum and the cap wafer; and depositing a conductive layer on the first layer of aluminum and through the opening to contact the frontside of the device wafer. Item 18 includes the method of item 17 and further includes performing chemical mechanical polishing on a backside of the device wafer after the step of attaching. Item 19 includes the method of item 18, and further includes depositing nitride having compressive stress on the frontside of the cap wafer prior to the step of attaching. Item 20 includes the method of item 19, wherein the step of depositing a conductive layer includes depositing a second layer of aluminum.

What is claimed is:

1. A method of making a capped micro-electro-mechanical systems device, comprise:
   forming a MEMS device using a device wafer, wherein the MEMS device is located on a frontside of the device wafer;
   attaching a frontside of a cap wafer to the frontside of the device wafer;
   applying a first stressor layer having a tensile stress to a backside of the cap wafer after attaching the frontside of the cap wafer to the frontside of the device wafer;
   patterning the first stressor layer and the cap wafer to form an opening through the first stressor layer and the cap wafer after applying the first stressor layer; and
   applying a conductive layer to the backside of the cap wafer, including through the opening to the frontside of the device wafer.

2. The method of claim 1, further comprising:
   applying a second stressor layer having a compressive stress to the frontside of the cap wafer prior to the step of attaching.

3. The method of claim 2, further comprising performing chemical mechanical polishing to the backside of the cap wafer prior after the step of attaching and before the step of applying the first stressor layer.

4. The method of claim 3, wherein the step of applying the first stressor layer comprises depositing a first layer of aluminum.

5. The method of claim 4, wherein the step of applying the second stressor layer comprises depositing a layer of nitride.

6. The method of claim 5, further comprising performing chemical mechanical polishing to the backside of the device wafer after the step of attaching.

7. The method of claim 6, wherein the step of applying a conductive layer comprises depositing a second layer of aluminum.

8. The method of claim 7, wherein the step of attaching comprises:
   applying frit to the frontside of the cap wafer;
   curing the frit; and
   contacting the frontside of the device wafer to the frit.

9. The method of claim 1, wherein the step of applying the first stressor layer comprises depositing a first layer of aluminum.

10. The method of claim 9, wherein the step of applying a conductive layer comprises depositing a second layer of aluminum.

11. The method of claim 10, further comprising:
    forming a bond pad opening in the cap wafer to expose a plurality of bond pads of the MEMS device.

12. A method of forming a packaged micro-electro-mechanical systems (MEMS) device, wherein the MEMS device is located on a frontside of a device wafer, comprising:
    forming a nitride layer having compressive stress on a frontside of a cap wafer;
    attaching the frontside of the cap wafer to the frontside of the device wafer;
    forming a first aluminum layer having tensile stress on the backside of the cap wafer;
    patterning the first aluminum layer and the cap wafer to form an opening through the cap wafer; and applying a conductive layer to the backside of the cap wafer, including through the opening to the frontside of the device wafer.

13. The method of claim 12, further comprising performing chemical mechanical polishing on the backside of the cap wafer after the step of attaching and before the step of forming the first aluminum layer.

14. The method of claim 13, further comprising performing chemical mechanical polishing on the backside of the device wafer after the step of attaching.

15. The method of claim 12, wherein the step of applying the conductive layer comprises depositing a second aluminum layer and is further characterized as contacting a ground contact on the device wafer.

16. The method of claim 12, wherein the step of attaching comprises:
   applying frit in a pattern to the frontside of the cap wafer;
   curing the frit; and
   contacting the frontside of the device wafer to the frontside of the cap wafer.

17. A method of packaging a micro-electro-mechanical systems (MEMS) device, comprising:
   forming the MEMS device on a frontside of a device wafer;
   attaching a frontside of a cap wafer to the frontside of the device wafer;
   performing chemical mechanical polishing on the backside of the cap wafer;
   depositing a first layer of aluminum on the backside of the cap wafer, the first layer of aluminum having tensile stress;
   forming an opening in the first layer of aluminum and the cap wafer; and
   depositing a conductive layer on the first layer of aluminum and through the opening to contact the frontside of the device wafer.

18. The method of claim 17, further comprising performing chemical mechanical polishing on a backside of the device wafer after the step of attaching.

19. The method of claim 18, further comprising depositing nitride having compressive stress on the frontside of the cap wafer prior to the step of attaching.

20. The method of claim 19, wherein the step of depositing a conductive layer comprises depositing a second layer of aluminum.

* * * * *